(12) United States Patent
Kim et al.

(10) Patent No.: US 10,658,442 B2
(45) Date of Patent: May 19, 2020

(54) ELECTROLUMINESCENT DISPLAY DEVICE

(71) Applicant: LG DISPLAY CO., LTD., Seoul (KR)

(72) Inventors: Seonghyun Kim, Paju-si (KR); HoJin Ryu, Paju-si (KR); YoungMu Oh, Wollong-myeon (KR); Suphil Kim, Paju-si (KR); Jonghoon Yeo, Paju-si (KR); Jihoon Lee, Paju-si (KR); Changyong Gong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/223,060

(22) Filed: Dec. 17, 2018

(65) Prior Publication Data

US 2019/0206956 A1 Jul. 4, 2019

(30) Foreign Application Priority Data

Dec. 29, 2017 (KR) .................. 10-2017-0184836

(51) Int. Cl.
*H01L 27/32* (2006.01)
(52) U.S. Cl.
CPC ........ *H01L 27/3246* (2013.01); *H01L 27/326* (2013.01); *H01L 27/3223* (2013.01); *H01L 27/3211* (2013.01); *H01L 27/3276* (2013.01)

(58) Field of Classification Search
CPC .................................................. H01L 27/3223
See application file for complete search history.

(56) References Cited

U.S. PATENT DOCUMENTS

| | | | |
|---|---|---|---|
| 2003/0156079 A1* | 8/2003 | Nakanishi ............ | G09G 3/3233 345/45 |
| 2009/0072724 A1* | 3/2009 | Seki ..................... | H01L 27/3246 313/504 |
| 2019/0122622 A1* | 4/2019 | Yatabe ................. | G09G 3/3611 |

* cited by examiner

Primary Examiner — Peniel M Gumedzoe
Assistant Examiner — Christopher A Johnson
(74) Attorney, Agent, or Firm — Polsinelli PC

(57) ABSTRACT

Disclosed is an electroluminescent display device capable of overcoming a problem related with static electricity in a GIP formation area, and improving a profile of an exterior device, wherein the electroluminescent display device may include a substrate having an active area and a non-active area, an active bank for defining an active emission area on the active area, a dummy bank for defining a dummy emission area on the non-active area, an active emission layer provided in the active emission area defined by the active bank, and a dummy emission layer provided in the dummy emission area defined by the dummy bank, wherein the dummy emission layer is relatively larger than the active emission layer.

19 Claims, 4 Drawing Sheets

ELECTROLUMINESCENT DISPLAY DEVICE

CROSS-REFERENCE TO RELATED APPLICATION

This application claims the benefit of the Korean Patent Application No. 10-2017-0184836 filed on Dec. 29, 2017, which is hereby incorporated by reference in its entirety as if fully set forth herein.

BACKGROUND

Field of the Disclosure

The present disclosure relates to a display device, and more particularly, to an electroluminescent display device. Although the present disclosure is suitable for a wide scope of applications, it is particularly suitable for solving a static electricity problem in a gate in panel (GIP) area of the electroluminescent display device and improving a profile of the exterior components.

Description of the Background

An electroluminescent display device is provided in such a way that an emission layer is formed between two electrodes. As the emission layer emits light by an electric field generated between the two electrodes, an image is displayed on the electroluminescent display device.

The emission layer may be formed of an organic material which emits light when exciton is produced by a bond of electron and hole, and the exciton falls to a ground state from an excited state. Otherwise, the emission layer may be formed of an inorganic material such as quantum dot.

Generally, a gate in panel (GIP) technology is recently applied to the electroluminescent display device. However, in case of the GIP type electroluminescent display device, static electricity can be generated in a GIP area. As a result, reliability of the devise can occur. Also, there are limitations in manufacturing process for forming an additional protection layer to protect the GIP area.

SUMMARY

The present disclosure has been made in view of the above problems, and the present disclosure is to provide an electroluminescent display device which is capable of overcoming a problem related with static electricity in a GIP area, and improving a profile of the exterior components.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, the present disclosure provides a rollable display in which a back plate, which serves to support a display panel, is variable in shape so as to be stored in a folded state inside an accommodating case using different characteristics thereof for each area without separate mechanical equipment.

In accordance with an aspect of the present disclosure, the above and other objects can be accomplished by the provision of an electroluminescent display device comprising a substrate having an active area and a non-active area provided in the periphery of the active area, an active bank for defining an active emission area on the active area of the substrate, a dummy bank for defining a dummy emission area on the non-active area of the substrate, an active emission layer provided in the active emission area defined by the active bank, and a dummy emission layer provided in the dummy emission area defined by the dummy bank, wherein an area of the dummy emission layer is relatively larger than an area of the active emission layer.

In another aspect of the present disclosure, an electroluminescent display device includes a substrate where an active area and a non-active area are defined, and the active area is an area where an image is displayed and the non-active area surrounds the active area; an active bank defining an active emission area where emitted light radiates; a dummy bank defining a dummy emission area where no emitted light radiates; first, second and third active emission layers disposed in the active emission area defined by the active bank and disposed in first, second and third sub-pixels, respectively; and a plurality of dummy emission layers disposed in the dummy emission area and each having an area larger than each of the first, second and third active emission layers.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above features and other advantages of the present disclosure will be more clearly understood from the following detailed description taken in conjunction with the accompanying drawings, in which.

DETAILED DESCRIPTION DISCLOSURE

Figure 1:
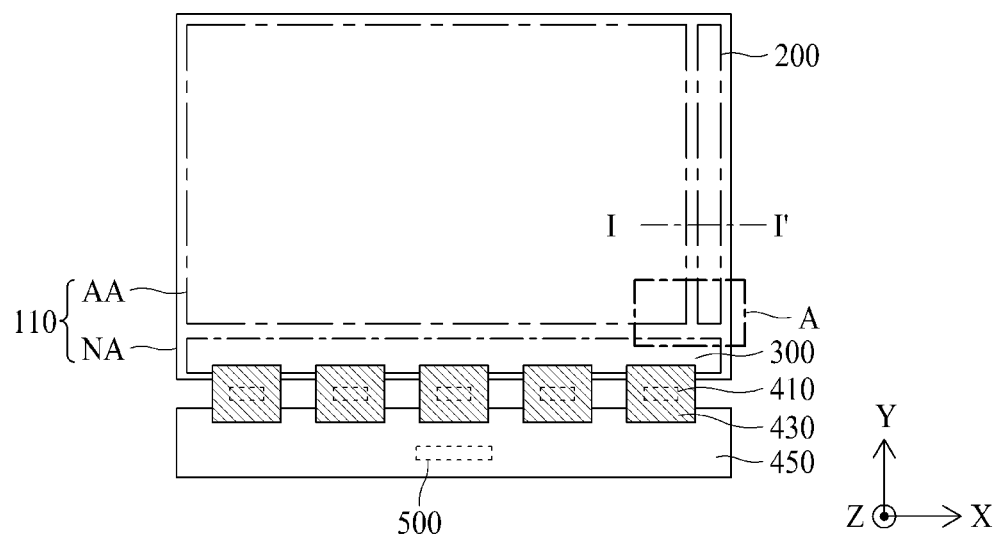
FIG. 1 is a plane view illustrating an electroluminescent display device according to an aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, an electroluminescent display device according to the aspect of the present disclosure will be described in detail with reference to the accompanying drawings.

FIG. 1 is a plane view illustrating an electroluminescent display device according to an aspect of the present disclosure. In FIG. 1, the X-axis indicates a direction which is parallel to a gate line, the Y-axis indicates a direction which is parallel to a data line, and the Z-axis indicates a height direction of the electroluminescent display device.

Referring to FIG. 1, the electroluminescent display device according to an aspect of the present disclosure may include a substrate 110, a gate driver 200, a pad portion 300, a source drive integrated circuit 410, a flexible film 430, a circuit board 450, and a timing controller 500.

The substrate 110 may be a flexible substrate. For example, the substrate 110 may include a transparent polyimide material. The substrate 100 of the polyimide material may be obtained by curing polyimide resin coated at a constant thickness onto a front surface of a release layer prepared in a carrier glass substrate. The carrier glass substrate is separated from the substrate 110 by the release of the release layer for a laser release process. On one surface of the substrate 110, there are gate lines, data lines, and pixels. The pixels may include a plurality of sub pixels, and the plurality of sub pixels are provided adjacent to crossing areas of the gate and data lines.

The substrate 110 according to an aspect of the present disclosure may include an active area AA and a non-active area NA.

The active area AA corresponds to an area for displaying an image thereon, which may be defined in the center of the substrate 110. The active area AA may be provided with the gate lines, the data lines and the pixels.

The non-active area NA corresponds to a non-display area on which an image is not displayed, wherein the non-active area NA may be defined in the periphery of the substrate 110 and surrounds the active area AA. The non-active area NA may be provided with the gate driver 200 and the pad portion 300.

The gate driver 200 supplies gate signals to the gate lines in accordance with a gate control signal which is provided from the timing controller 500. The gate driver 200 may be provided in the non-active area NA at an outer side of the active area AA of the substrate 110 by a GIP (i.e., gate driver in panel) method.

The gate driver 200 according to an aspect of the present disclosure is formed in the GIP method, and a problem related with generation of static electricity may occur. For example, the gate driver 200 of the GIP method is disposed in the periphery of the substrate 110. Unlike the active area AA, additional insulating components may not be disposed on the gate driver 200, whereby static electricity may be applied to the gate driver 200. However, in case of the electroluminescent display device according to an aspect of the present disclosure, a dummy bank may be formed on the gate driver 200, so that static electricity generated in the gate driver 200 can be prevented, to thereby ensure reliability. This will be described in detail later.

The pad portion 300 supplies data signals to the data lines in accordance with a data control signal which is provided from the timing controller 500. The pad portion 300 is provided to the non-active area NA disposed at an outer side of the active area AA of the substrate 110. A driver may be manufactured in an integrated circuit chip, and mounted on the flexible film 430 including the circuit lines. The flexible film 430 may be attached and electrically connected to the pad portion 300 by a TAB (i.e., tape automated bonding) method.

The source drive integrated circuit 410 receives digital video data and a source control signal from the timing controller 500. The source drive integrated circuit 410 converts the digital video data into analog data voltages in accordance with the source control signal, and provides the analog data voltages to the data lines. When the source drive integrated circuit 410 is manufactured in a driving chip, the source drive integrated circuit 410 may be mounted on the flexible film 430 by a COF (chip on film) method or a COP (chip on plastic) method.

The flexible film 430 may be provided with lines for connecting the pad portion 300 and the source drive integrated circuit 410 with each other, and lines for connecting the pad portion 300 and the circuit board 450 with each other. The flexible film 430 is attached onto the pad portion 300 by the use of anisotropic conducting film, whereby the pad portion 300 may be connected with the lines of the flexible film 430.

The circuit board 450 may be attached to the flexible films 430. A plurality of circuits, which are embodied in driving chips, may be mounted on the circuit board 450. For example, the timing controller 500 may be mounted on the circuit board 450. The circuit board 450 may be a printed circuit board or flexible printed circuit board.

The timing controller 500 receives the digital video data and a timing signal from an external system board via a cable of the circuit board 450. The timing controller 500 generates a gate control signal for controlling an operation timing of the gate driver 200, and a source control signal for controlling the source drive integrated circuits 410 on the basis of timing signal. The timing controller 500 supplies the gate control signal to the gate driver 200, and supplies the source control signal to the source drive integrated circuits 410.

Figure 2:
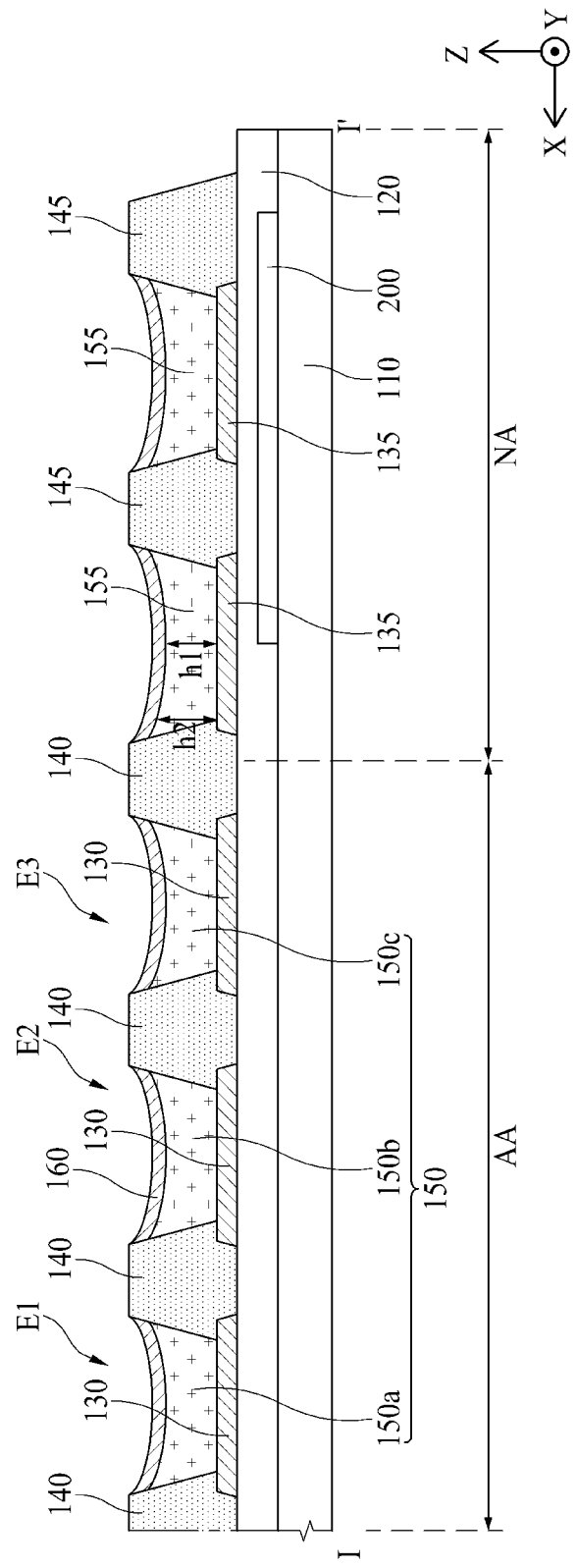
FIG. 2 is a cross-sectional view taken along line I-I' of FIG. 1.

FIG. 2 is a cross-sectional view taken along line I-I' of FIG. 1.

Referring to FIG. 2, the electroluminescent display device according to an aspect of the present disclosure may include a substrate 110, a circuit device layer 120, first electrodes 130 and 135, banks 140 and 145, emission layers 150 and 155, and a second electrode 160.

The substrate 110 may be a flexible substrate, as described above, but not limited to this type.

When the electroluminescent display device according to an aspect of the present disclosure is implemented as a top emission type in which the emitted light radiates toward an upper side, the substrate 110 may be formed of an opaque material as well as a transparent material. When the electroluminescent display device according to an aspect of the present disclosure is a bottom emission type in which the emitted light radiates toward a lower side, the first substrate 110 can be formed of only a transparent material.

The circuit device layer 120 is formed on the substrate 110.

In the circuit device layer 120 according to an aspect of the present disclosure, a circuit device including various signal lines, a thin film transistor, and a capacitor is provided for each pixel. The signal lines may include a gate line, a data line, a power line, and a reference line. The thin film transistor may include a switching thin film transistor, a driving thin film transistor, and a sensing thin film transistor.

As the switching thin film transistor is switched in accordance to a gate signal supplied to the gate line, a data voltage provided from the data line is supplied to the driving thin film transistor.

As the driving thin film transistor is switched in accordance to the data voltage supplied from the switching thin film transistor, a data current is generated by power supplied from the power line, and the generated data current is supplied to the first electrodes 130 and 135.

The sensing thin film transistor senses a threshold voltage deviation of the driving thin film transistor, which causes a deterioration of picture quality. The sensing thin film transistor supplies a current of the driving thin film transistor to the reference line in response to a sensing control signal supplied from the gate line or an additional sensing line.

The capacitor maintains the data voltage supplied to the driving thin film transistor for one frame period. The capacitor is connected with each of gate and source electrodes of the driving thin film transistor.

The gate driver 200 according to an aspect of the present disclosure is disposed in the circuit device layer 120. The gate driver 200 according to an aspect of the present disclosure may be formed in a GIP method, wherein the gate driver 200 may include a thin film transistor and a GIP wiring. The GIP wiring may be connected with the gate line, and may supply gate signals to the active area AA.

The first electrodes 130 and 135 are formed on the circuit device layer 120. The first electrodes 130 and 135 may include an active first electrode 130, and a dummy first electrode 135.

The active first electrode 130 is patterned by each pixel in the active area AA. The active first electrode 130 may function as an anode of the electroluminescent display device.

When the electroluminescent display device according to an aspect of the present disclosure is a top emission type, the active first electrode 130 may include a reflective material for upwardly reflecting the light emitted from the emission layers 150 and 155. In this case, the active first electrode 130 may be formed in a stacked structure of a transparent conductive material and the reflective material. When the electroluminescent display device according to an aspect of the present disclosure is a bottom emission type, the active first electrode 130 may be formed of only a transparent conductive material.

The dummy first electrode 135 is patterned in the non-active area NA. The dummy first electrode 135 may be formed in the same structure as the active first electrode 130. The dummy first electrode 135 and the active first electrode 130 may be manufactured by the same process. However, the dummy first electrode 135 can be omitted, whereby light emission is not generated in the non-active area NA.

The banks 140 and 145 are formed in a matrix configuration on the boundary line between each of the plurality of pixels, to thereby define the emission areas in the plurality of pixels. That is, an opening portion of each pixel in which the banks 140 and 145 are not formed becomes the emission area.

The banks 140 and 145 according to an aspect of the present disclosure are configured to cover both ends of the first electrodes 130 and 135, and are formed on the circuit device layer 120. Thus, the plurality of first electrodes 130 and 135 respectively patterned for the plurality of pixels may be insulated from each other by the banks 140 and 145.

The banks 140 and 145 according to an aspect of the present disclosure may include an active bank 140 and a dummy bank 145.

The active bank 140 is formed at the active area AA of the substrate 110. The active bank 140 may define an active emission area at the active area AA. In order to define the active emission area at the active area AA, the active bank 140 may be formed at the boundary area between the active area AA and the non-active area NA. For example, the left-side portions of the active bank 140 formed in the boundary area between the active area AA and the non-active area NA may be positioned in the active area AA, and the right-side portions of the active bank 140 may be positioned in the non-active area NA.

The dummy bank 145 is formed at the non-active area NA of the substrate 110. The dummy bank 145 may define a dummy emission area at the non-active area NA.

The banks 140 and 145 according to an aspect of the present disclosure may be formed of an organic insulating material having a hydrophilic property. In this case, the emission layer 150 and 155 smoothly spreads to a side surface (or a side wall) of the banks 140 and 145 so that the emission layer 150 and 155 is uniformly deposited/spread in each emission area.

Meanwhile, when the entire area of the banks 140 and 145 have a hydrophilic property, the emission layer 150 or 155 formed in any one emission area overflows into the neighboring emission area over an upper surface of the banks 140 and 145, whereby the emission layer 150 or 155 formed in any one emission area may be mixed together with the emission layer 150 or 155 formed in the neighboring emission area. Thus, the upper surface of the banks 140 and 145 has a hydrophobic property, so that the mixture of the neighboring emission layers 150 and 155 can be prevented.

To this end, the banks 140 and 145 may be obtained by coating a mixture solution of an organic insulating material having a hydrophilic property and a hydrophobic material such as fluorine, and patterning the coated mixture solution by the use of photolithography process. By the light irradiated for the photolithography process, the hydrophobic material such as fluorine may move to an upper portion of the banks 140 and 145, whereby the upper portion of the banks 140 and 145 may have a hydrophobic property, and the remaining portions of the banks 140 and 145 may have a hydrophilic property. In this case, the upper surface of the banks 140 and 145 has a hydrophobic property, so that it is possible to decrease the spread of the neighboring emission layers 140 and 155 into the upper surface of the banks 140 and 145 to some degree. Accordingly, a problem related with the mixture of the neighboring emission layers 150 and 155 can be solved.

The emission layer 150 and 155 is formed on the first electrodes 130 and 135. In detail, the emission layers 150 and 155 are formed in the emission areas defined by the banks 140 and 145.

The emission layers 150 and 155 according to an aspect of the present disclosure are patterned in each emission area by a solution process without a mask. In this case, a height (h1) of an upper end of the emission layers 150 and 155 at the center of the emission area after a drying process of drying the solution for forming the emission layers 150 and 155 is lower than a height (h2) of an upper end of the emission layers 150 and 155 at the side of the emission area, and more particularly, at the end (or circumference) of the emission area being in contact with the banks 140 and 145. Especially, as shown in the drawings, according as the height of the emission layers 150 and 155 are gradually lowered from the end of the emission area being in contact with the banks 140 and 145 to the center of the emission area, it is possible to realize a gradually-lowered profile shape.

The emission layers 150 and 155 according to an aspect of the present disclosure may include an active emission layer 150 and a dummy emission layer 155.

The active emission layer 150 may include a first active emission layer 150a provided in a first emission area E1 of a first sub pixel, a second active emission layer 150b provided in a second emission area E2 of a second sub pixel, and a third active emission layer 150c provided in a third emission area E3 of a third sub pixel.

The first active emission layer 150a may include a hole injecting layer (HIL), a hole transporting layer (HTL), and a red emitting material layer (EML(R)). The second active emission layer 150b may include a hole injecting layer (HIL), a hole transporting layer (HTL), and a green emitting material layer (EML(G)). The third active emission layer 150c may include a hole injecting layer (HIL), a hole transporting layer (HTL), and a blue emitting material layer (EML(B)).

The hole injecting layer is formed in each of the first to third emission areas E1, E2 and E3 by a solution process, whereby the hole injecting layer is included in each of the first active emission layer 150a, the second active emission layer 150b, and the third active emission layer 150c. The hole transporting layer is formed in each of the first to third emission areas E1, E2 and E3 by a solution process, whereby the hole transporting layer is included in each of the first active emission layer 150a, the second active emission layer 150b, and the third active emission layer 150c. The red emitting material layer, the green emitting material layer, and the blue emitting material layer are respectively formed in the first to third emission areas E1, E2 and E3 by a solution process, whereby the red emitting material layer, the green emitting material layer, and the blue emitting material layer are respectively included in the first active emission layer 150a, the second active emission layer 150b, and the third active emission layer 150c.

The active emission layer 150 includes the hole injecting layer and the hole transporting layer so as to transmit a hole generated in the active first electrode 130 to the red emitting material layer, the green emitting material layer, and the blue emitting material layer.

The active emission layer 150 may not include an electron injecting layer and an electron transporting layer for transmitting an electron generated in the second electrode 160 to the red emitting material layer, the green emitting material layer, and the blue emitting material layer. Otherwise, at least one of the electron injecting layer and the electron transporting layer may be included in the active emission layer 150.

The dummy emission layer 155 is formed in the non-active area NA. In detail, the dummy emission layer 155 may be formed on the dummy first electrode 135.

The dummy emission layer 155 is formed in the non-active area NA where an image is not displayed, therefore light emission is not generated in the dummy emission layer 155. The dummy emission layer 155 is provided to realize a uniform profile between the active emission layer 150 formed in the middle of the active area AA and the active emission layer 155 formed in the periphery of the active area AA.

When the emission 150 and 155 is formed by a solution process, it may cause the difference between a drying speed of the emission layer 150 formed in the middle of the active area AA and a drying speed of the emission layer 150 formed in the periphery of the active area AA. Thus, when only the active emission layer 150 is provided without the dummy emission layer 155, the profile of the active emission layer 150 formed in the middle of the active area AA and the profile of the emission layer 150 formed in the periphery of the active area AA may be not uniform. As a result, the light emission in the center of the active area AA and the light emission in the periphery of the active area AA may be not uniform.

Thus, in case of the electroluminescent display device according to an aspect of the present disclosure, when the active emission layer 150 is formed in the active area AA by the solution process, the dummy emission layer 155 is also formed in the non-active area NA by the solution process. In this case, even though the profile of the dummy emission layer 155 is not uniform, it is possible to realize the uniform profile of the active emission layer 150 in the entire active area AA.

A structure of the dummy emission layer 155 according to an aspect of the present disclosure may be different from a structure of the active emission layer 150. For example, the dummy emission layer 155 may have a relatively larger area in comparison to the active emission layer 150. Thus, a dummy pattern including the dummy emission layer 155 and the dummy bank 145 adjacent to the dummy emission layer 155 may have a relatively large area in comparison to an area of one sub pixel formed in the active area AA. When the area of the dummy emission layer 155 is larger than the area of the active emission layer 150, it is possible to realize the more uniform profile of the active emission layer 150. For example, when providing the relatively larger area in the dummy pattern including the dummy emission layer 155, a plurality of sub pixels may be covered by the dummy pattern, whereby the profile of the active emission layer 150 included in the plurality of sub pixels may be more uniform. Thus, when the dummy pattern is formed in the size corresponding to the plurality of sub pixels instead of one sub pixel, the profile of the active emission layer 150 included in the plurality of sub pixels may be more uniform.

The second electrode 160 is formed on the emission layers 150 and 155. The second electrode 160 may function as a cathode of the electroluminescent display device.

As described above, when the electron injecting layer and the electron transporting layer are not included in the emission layer 150 and 155, the second electrode 160 may include a material having the electron injecting property and the electron transporting property. For example, in order to provide the second electrode 160 functioning as the cathode, the second electrode 160 may include a conductive material such as argentums (Ag). In order to provide the second electrode 160 having an electron injecting property and an electron transporting property, the second electrode 160 may include at least one among alkali component, metal oxide, and metal carbonate. The second electrode 160 may be manufactured by mixing ink including argentums (Ag) with at least one among alkali component, metal oxide, and metal carbonate, and carrying out a solution process for the above mixture by the use of inkjet apparatus.

According to an aspect of the present disclosure, all of the emission layers 150 and 155 and the second electrode 160 may be formed by a solution process, so that manufacturing cost processing time can be reduced. Especially, the second electrode 160 includes the material having an electron injecting property and an electron transporting property so that it is possible to omit an electron injecting layer and an electron transporting layer from the emission layers 150 and 155, thereby shortening processing time for forming the emission layers 150 and 155.

When the electroluminescent display device according to an aspect of the present disclosure is a top emission type, the second electrode 160 may be formed of a transparent conductive material for upwardly advancing light emitted from the emission layers 150 and 155, or may be formed at a small thickness so as to improve transmittance. When the electroluminescent display device according to an aspect of the present disclosure is a bottom emission type, the second electrode 160 may include a reflective material for downwardly reflecting light emitted from the emission layers 150 and 155.

As the second electrode 160 according to an aspect of the present disclosure is formed by the solution process, the profile of the second electrode 160 may correspond to the profile of the emission layers 150 and 155.

Although not shown in detail, an encapsulation layer may be additionally formed on the second electrode 160. The encapsulation layer prevents external moisture and oxygen from being permeated into the emission layer 150 and 155. The encapsulation layer may be formed of an inorganic insulating material, or may be formed in a deposition structure obtained by alternately depositing an inorganic insulating material and an organic insulating material, but not limited to these structures.

Figure 3:
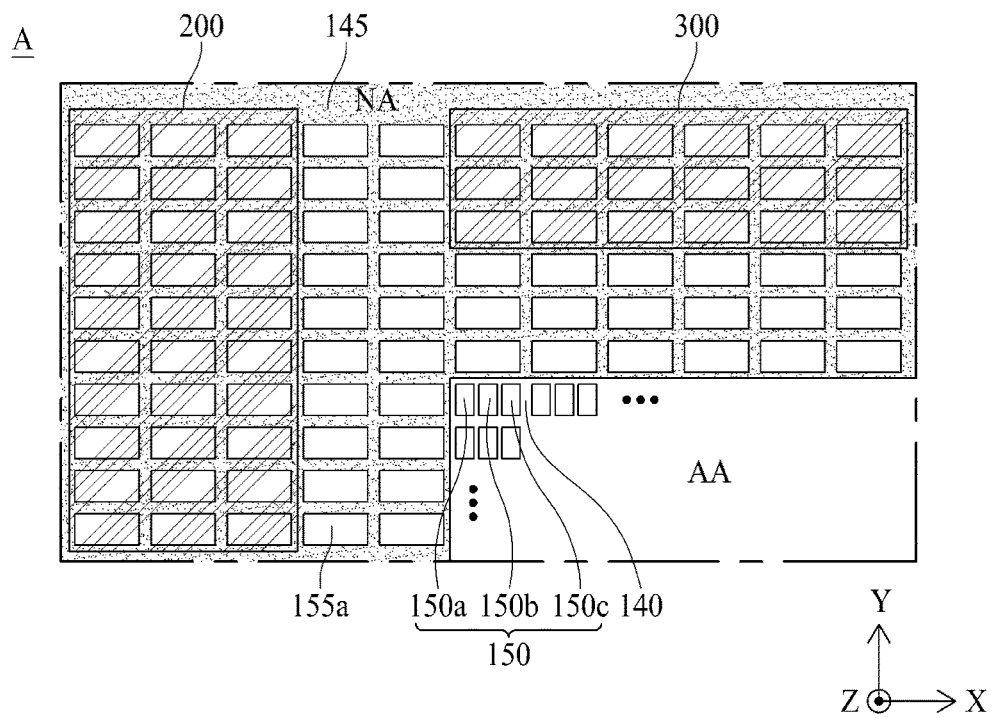
FIG. 3 is a cross-sectional view showing enlarged 'A' portion of FIG. 1 in an electroluminescent display device according to the first aspect of the present disclosure.

FIG. 3 is a cross-sectional view showing enlarged 'A' portion of FIG. 1 in an electroluminescent display device according to a first aspect of the present disclosure. Hereinafter, a detailed description for the same parts as those of the above explanation will be omitted, and only the different structures will be described in detail as follows.

Referring to FIG. 3, the electroluminescent display device according to the first aspect of the present disclosure may include banks 140 and 145, an active emission layer 150 formed in an active area AA of a substrate 110, and a plurality of first dummy emission layers 155a formed in a non-active area NA of the substrate 110.

The banks 140 and 145 may be formed in a pattern shape on the entire surface of the substrate 110. The banks 140 and 145 may be formed of an organic insulating material.

The dummy bank 145 according to an aspect of the present disclosure is formed on a gate driver 200, to thereby prevent static electricity in the gate driver 200. For example, the dummy bank 145 is provided in a pattern shape on the gate driver 200, and the dummy bank 145 is formed of an organic insulating material. The dummy bank 145 is formed of an insulating material capable of preventing a flow of the current, whereby it is possible to prevent static electricity from being applied from the external to the gate driver 200 through a surface of the electroluminescent display device. Accordingly, the dummy bank 145 prevents the static electricity from being generated in the gate driver 200 so that it is possible to prevent a circuit inside the gate driver 200 from being physically damaged, or to prevent a thin film transistor formed in the active area AA from being damaged by the static electricity flowing through a wiring connected with the gate driver 200. Thus, the electroluminescent display device according to the first aspect of the present disclosure prevents the static electricity from being generated, and also prevents defects caused by the static electricity, thereby improving reliability of the electroluminescent display device.

As described above, the active emission layer 150 may include a first active emission layer 150a, a second active emission layer 150b, and a third active emission layer 150c. In this case, the first active emission layer 150a includes a red emitting material layer, the second active emission layer 150b includes a green emitting material layer, and the third active emission layer 150c includes a blue emitting material layer. In FIG. 3, the first active emission layer 150a, the second active emission layer 150b, and the third active emission layer 150 have the same width, but not limited to this structure. For example, the third active emission layer 150c has the largest width, the second active emission layer 150b has the middle width, and the first active emission layer 150a has the smaller width. Herein, the width corresponds to the horizontal direction, and the horizontal direction corresponds to the direction which is parallel to the X-axis.

The plurality of first dummy emission layers 155a are formed in the non-active area NA. For example, the plurality of first dummy emission layers 155a may be prepared on an entire surface of the non-active area NA including the gate driver 200 and a pad portion 300. As described above, the plurality of first dummy emission layers 155a may be provided to realize a uniform profile of the active emission layer 150.

The first dummy emission layer 155a according to the first aspect of the present disclosure may have the width which is identical to a total value obtained by adding each width of the first to third active emission layers 150a, 150b and 150c together. For example, the first dummy emission layer 155a may have the width which is identical to the total value obtained by adding each width of the first to third active emission layers 150a, 150b and 150c so as to realize the uniform profile in the first to third active emission layers 150a, 150b and 150c formed in the periphery of the active area AA. Thus, the first dummy emission layer 155a forms one first dummy pattern, and one first dummy pattern is provided to realize a uniform profile in one unit pixel comprising first to third sub pixels. The plurality of first dummy emission layers 155a may form the plurality of first dummy patterns, and may be provided on the entire surface of the non-active area NA so as to realize the uniform profile in the plurality of unit pixels.

In the electroluminescent display device according to the first aspect of the present disclosure, the first dummy emission layer 155a and the dummy bank 145 are formed in the non-active area NA so that it is possible to prevent the static electricity and to realize the uniform profile in the active emission layer 150. That is, the plurality of first dummy patterns including the plurality of first dummy emission layers 155a and the dummy bank 145 for defining the first dummy emission layer 155a are formed in the non-active area NA so that it is possible to prevent the static electricity from being generated in the gate driver 200, to realize the uniform profile of the active emission layer 155 in the periphery of the active area AA, and to realize the uniform profile of the active emission layer 155 prepared in the entire surface of the active area AA.

Figure 4:
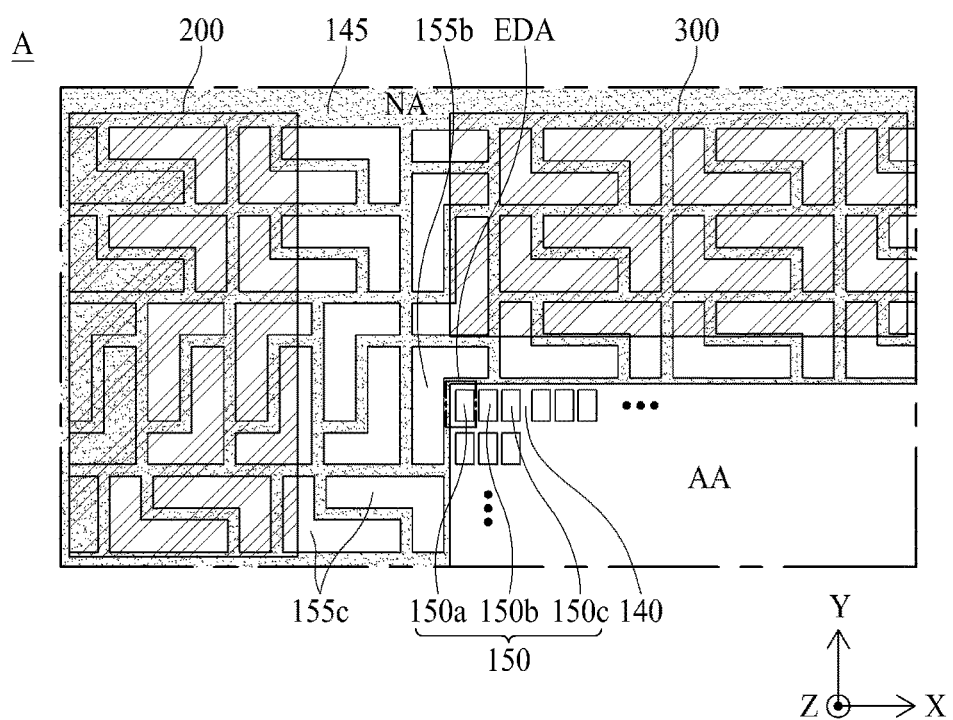
FIG. 4 is a cross-sectional view showing enlarged 'A' portion of FIG. 1 in an electroluminescent display device according to the second aspect of the present disclosure.

FIG. 4 is a cross-sectional view showing enlarged 'A' portion of FIG. 1 in an electroluminescent display device according to a second aspect of the present disclosure. A structure of a dummy pattern shown in FIG. 4 is different from that of FIG. 3. Hereinafter, a detailed description for the same parts as those of the above explanation will be omitted, and only the different structures will be described in detail as follows.

Referring to FIG. 4, the electroluminescent display device according to the second aspect of the present disclosure includes a second dummy emission layer 155b, a plurality of third dummy emission layers 155c, and a dummy bank 145 formed in a non-active area NA of a substrate 110.

The second dummy emission layer 155b is formed in the non-active area NA. The second dummy emission layer 155b may be formed in a shape which is perpendicularly bent to surround a corner edge area EDA of an active area AA. Herein, as shown in the drawings, the corner edge area (EDA) may be shown in the area where the adjacent two boundary lines are perpendicular to each other among the four boundary lines between the active area AA and the non-active area NA.

The second dummy emission layer 155b according to the second aspect of the present disclosure is formed in a perpendicularly-bent shape. For example, the second dummy emission layer 155b is formed in shape of "¬" so as to surround the corner edge area EDA. An active emission layer 150 formed in the corner edge area EDA has the largest area facing the non-active area NA, which cases a large possibility of non-uniformity in its profile. In the electroluminescent display device according to the second aspect of the present disclosure, the second dummy emission layer 155b is formed to surround the corner edge area EDA so that it is possible to realize the uniform profile of the active emission layer 150 formed in the corner edge area EDA and to realize the uniform profile in the plurality of active emission layers 150 prepared in the entire surface of the active area AA.

The plurality of third dummy emission layers 155c are formed in the non-active area NA. For example, the plurality of third dummy emission layers 155c may be prepared on the entire surface of the non-active area NA including a gate driver 200 and a pad portion 300. A shape of the third dummy emission layer 155c may be identical to a shape of the second dummy emission layer 155b, and the plurality of third dummy emission layers 155c may be arranged on the most surface of the non-active area NA. Among the plurality of third dummy emission layers 155c, the adjacent two of the third dummy emission layers 155c are arranged to confront with each other so as to form a rectangular shape. As shown in FIG. 3, the plurality of third dummy emission layers 155c may be formed in the rectangular shape, and may be arranged on the entire surface of the non-active area NA, to thereby improve the profile in the active emission layer 150.

The dummy bank 145 is formed on the non-active area NA of the substrate 110. The dummy bank 145 is formed among each of the second dummy emission layers 155b and the plurality of third dummy emission layers 155c. The dummy bank 145 is formed on the gate driver 200 so that it is possible to prevent the static electricity from being generated in the gate driver 200, and to realize the uniform profile in the pixel of the active area AA by the use of second dummy pattern and the third dummy pattern together with the second and third dummy emission layers 155b and 155c, as described above.

For example, the second dummy pattern formed in the bent shape (or bracket shape, or a perpendicularly bent shape), for example, the shape of "¬" is obtained by the second dummy emission layer 155b and its adjoining dummy bank 145, to thereby surround the corner edge area EDA. As shown in the drawings, the dummy bank 145 surrounding the second dummy emission layer 155b is formed in the perpendicularly-curved shape, for example, the shape of "¬".

In the same manner, the third dummy pattern formed in the bent shape (or bracket shape, or a perpendicularly bent shape), for example, the shape of "¬" is obtained by the plurality of third dummy emission layers 155c and its adjoining dummy bank 145, and the third dummy pattern may be arranged on the entire surface of the non-active area NA. The third dummy pattern is identical in shape to the second dummy pattern. Among the plurality of third dummy patterns, the adjacent two of the third dummy patterns are arranged to confront with each other so as to form a rectangular shape. In this case, when the adjacent two of the third dummy patterns are arranged to confront with each other, the dummy bank 145 prepared between the two of the third dummy emission layers 155c may be shared by the two of the third dummy patterns confronting each other.

In order to form the second dummy emission layer 155b and the plurality of third dummy emission layers 155c, the dummy bank 145 is formed among each of the second dummy emission layer 155b and the plurality of third dummy emission layers 155c, to thereby provide the second dummy emission layer 155b and the second dummy pattern, and the plurality of third dummy emission layers 155c and the third dummy pattern. The second dummy pattern and the plurality of third dummy patterns may realize the uniform profile in the pixel of the active area AA.

Figure 5:
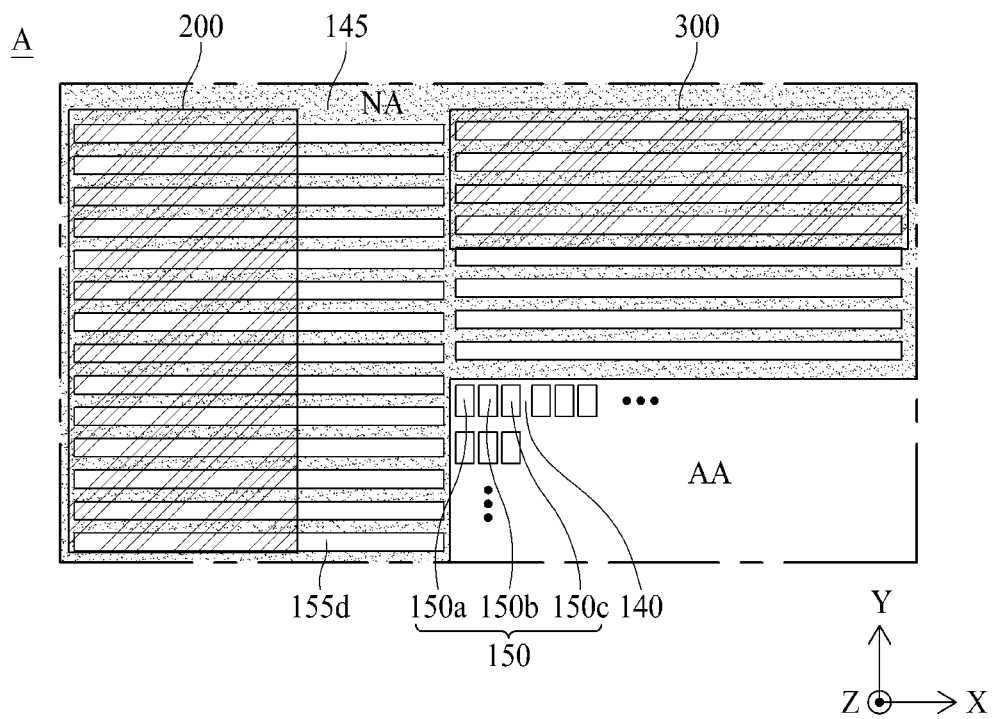
FIG. 5 is a cross-sectional view showing enlarged 'A' portion of FIG. 1 in an electroluminescent display device according to the third aspect of the present disclosure.

FIG. 5 is a cross-sectional view showing enlarged 'A' portion of FIG. 1 in an electroluminescent display device according to a third aspect of the present disclosure. A structure of a dummy pattern shown in FIG. 5 is different from that of FIG. 3. Hereinafter, a detailed description for the same parts as those of the above explanation may be omitted, and only the different structures would be described in detail as follows.

Referring to FIG. 5, the electroluminescent display device according to the third aspect of the present disclosure includes a plurality of fourth dummy emission layers 155d and a dummy bank 145 formed in a non-active area NA of a substrate 110.

The plurality of fourth dummy emission layers 155d are formed in the non-active area NA. For example, the plurality of fourth dummy emission layers 155d is prepared on the most surfaces of the non-active area NA including a gate driver 200 and a pad portion 300. The plurality of fourth dummy emission layers 155d may be formed to have a stripe shape.

The fourth dummy emission layer 155d according to an aspect of the present disclosure may have the stripe shape. For example, the fourth dummy emission layer 155d may extend in a horizontal direction (X-axis), and the plurality of fourth dummy emission layers 155d may have the stripe shape extending in the horizontal direction (X-axis).

The plurality of fourth dummy emission layers 155d according to an aspect of the present disclosure have the stripe shape extending in the horizontal direction, whereby it is favorable to a manufacturing process. For example, when an emission layer 150 and 155 is formed by a solution process, a solution may be coated in the horizontal direction from the non-active area NA with the gate driver 200 to its opposite-side non-active area NA. In this case, the fourth dummy emission layer 155d is formed in the structure extending in the direction of coating the solution, which enables processing convenience in comparison to another structure.

The dummy bank 145 is formed on the non-active area NA of the substrate 110. The dummy bank 145 is formed between each of the plurality of fourth dummy emission layers 155d, to thereby define dummy emission areas. The dummy bank 145 is provided on the gate driver 200, as described above, so that it is possible to prevent static electricity from being generated in the gate driver 200, and to realize the uniform profile of an active area AA through the use of fourth dummy pattern together with a plurality of fourth dummy emission layers 155.

For example, the fourth dummy emission layer 155d and its adjoining dummy bank 145 may be formed in the stripe shape extending in the horizontal direction (X-axis). Also, as shown in the drawings, the dummy bank 145 surrounding the fourth dummy emission layer 155d may be formed in the stripe shape.

In order to form the plurality of fourth dummy emission layers 155d, the dummy bank 145 is formed between each of the plurality of fourth dummy emission layers 155d, whereby it is possible to provide the fourth dummy emission layer 155d and the fourth dummy pattern, and furthermore, to realize the uniform profile of the pixel in the active area AA by the plurality of fourth dummy patterns.

Figure 6:
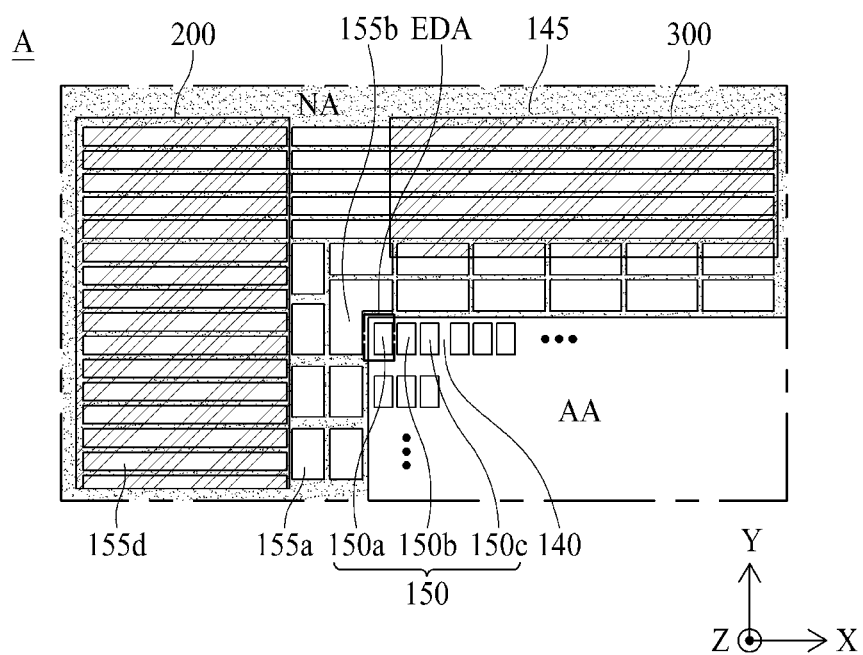
FIG. 6 is a cross-sectional view showing enlarged 'A' portion of FIG. 1 in an electroluminescent display device according to the fourth aspect of the present disclosure.

FIG. 6 is a cross-sectional view showing enlarged 'A' portion of FIG. 1 in an electroluminescent display device according to a fourth aspect of the present disclosure. FIG. 6 shows a structure obtained by combining dummy patterns of FIGS. 3 to 5. Hereinafter, a detailed description for the same parts as those of the above explanation may be omitted, and only the different structures would be described in detail as follows.

Referring to FIG. 6, the electroluminescent display device according to the fourth aspect of the present disclosure includes a second dummy emission layer 155b, a plurality of first dummy emission layers 155a, and a plurality of fourth dummy emission layers 155d formed in a non-active area NA of a substrate 110.

The second dummy emission layer 155b is formed in the non-active area NA. The second dummy emission layer 155b may be formed in a shape which is perpendicularly bent to surround a corner edge area EDA of an active area AA. The shape of the second dummy emission layer 155b is identical to that of the second dummy emission layer 155b shown in FIG. 4, whereby a detailed description for the shape of the second dummy emission layer 155b may be omitted.

The plurality of first dummy emission layers 155a is provided to surround the second dummy emission layer 155b. As shown in FIG. 6, the plurality of first dummy emission layers 155a are provided to surround the second dummy emission layer 155b, and are formed in the area adjacent to the second dummy emission layer 155b so that it is possible to surround the side edges of the remaining active area AA in which the second dummy emission layer 155b is not formed. A detailed structure of the first dummy emission layer 155a is similar to that of the first dummy emission layer 155a shown in FIG. 3, whereby a detailed description for the detailed structure of the first dummy emission layer 155a may be omitted.

The plurality of fourth dummy emission layers 155d is formed to surround the plurality of first dummy emission layer 155a. That is, the fourth dummy emission layer 155d is formed in the periphery of the non-active area NA. A detailed structure of the fourth dummy emission layer 155d is identical to that of the fourth dummy emission layer 155d shown in FIG. 5, whereby a detailed description for the detailed structure of the fourth dummy emission layer 155d may be omitted.

Accordingly, the electroluminescent display device according to the fourth aspect of the present disclosure includes the first dummy emission layer 155a, the second dummy emission layer 155b, and the fourth dummy emission layer 155d so that it is possible to realize the uniform profile of the active emission layer 150 included in one unit pixel, to improve the profile of the active emission layer 150 formed in the corner edge area EDA, and to ensure convenience on manufacturing process. That is, it is possible to improve the profile of the active emission layer 150 formed in the corner edge area EDA by the use of second dummy emission layer 155b, to realize the uniform profile of the active emission layer 150 included in one unit pixel by the use of first dummy emission layer 155a, and to obtain more convenience on manufacturing process by the use of fourth dummy emission layer 155d.

Accordingly, the electroluminescent display device according to the present disclosure is capable of improving reliability by preventing the static electricity in the GIP formation area, and also improving the properties of exterior device by providing the improved profile therein.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. An electroluminescent display device comprising:
   a substrate having an active area and a non-active area surrounding the active area;
   an active bank defining an active emission area at the active area of the substrate;
   a dummy bank defining a dummy emission area at the non-active area of the substrate;
   an active emission layer provided in the active emission area defined by the active bank; and
   a dummy emission layer provided in the dummy emission area defined by the dummy bank, wherein the dummy emission layer has an area larger than the active emission layer,
   wherein the dummy emission layer includes a plurality of first dummy emission layers,
   wherein the first dummy emission layer and a portion of the dummy bank adjacent to the first dummy emission layer form a first dummy pattern,
   wherein the active emission layer includes:
      a first active emission layer in a first sub pixel;
      a second active emission layer in a second sub pixel; and
      a third active emission layer in a third sub pixel, and
   wherein the first dummy emission layer has a width identical to a total width of the first to third active emission layers.

2. The electroluminescent display device according to claim 1, further comprising a gate driver provided at the non-active area of the substrate, wherein the dummy bank and the dummy emission layer are provided on the gate driver.

3. The electroluminescent display device according to claim 1, wherein the dummy bank surrounds the first dummy emission layer.

4. The electroluminescent display device according to claim 1, wherein the dummy emission layer includes:
   a second dummy emission layer having a bent shape surrounding a corner edge area in the active area of the substrate; and
   a plurality of third dummy emission layers having the same shape as the second dummy emission layer and arranged at the non-active area of the substrate.

5. The electroluminescent display device according to claim 4, wherein, among the plurality of third dummy emission layers, adjacent two of the third dummy emission layers are arranged to face each other as a rectangular shape.

6. The electroluminescent display device according to claim 5, wherein the dummy bank has the bent shape surrounding the second dummy emission layer and the plurality of third dummy emission layers.

7. The electroluminescent display device according to claim 1, wherein the dummy emission layer has a stripe shape.

8. The electroluminescent display device according to claim 7, wherein the dummy bank has the stripe shape and surrounds the dummy emission layer.

9. The electroluminescent display device according to claim 1, wherein the dummy emission layer includes:
   a second dummy emission layer having a bent shape surrounding a corner edge area in the active area of the substrate; and
   a plurality of third dummy emission layers having a stripe shape,
   wherein the plurality of first dummy emission layers surround the second dummy emission layer; and
   wherein the plurality of the third dummy emission layers surrounds the plurality of the first dummy emission layers.

10. The electroluminescent display device according to claim 9, wherein the dummy bank surrounds the second dummy emission layer, the plurality of the first dummy emission layers and the plurality of the third dummy emission layers.

11. The electroluminescent display device according to claim 2, wherein the active bank and the dummy bank are formed of an organic insulating material.

12. An electroluminescent display device comprising:
    a substrate where an active area and a non-active area are defined, and the active area is an area where an image is displayed and the non-active area surrounds the active area;
    an active bank defining an active emission area where emitted light radiates;
    a dummy bank defining a dummy emission area where no emitted light radiates;
    first, second and third active emission layers disposed in the active emission area defined by the active bank and disposed in first, second and third sub-pixels, respectively; and
    a plurality of dummy emission layers disposed in the dummy emission area and each having an area larger than each of the first, second and third active emission layers,
    wherein the plurality of dummy emission layers include:
       a first dummy emission layer having a width the same as a total width of the first to third active emission layers;
       a second dummy emission layer having a bent shape surrounding a corner edge area in the active area;
       a third dummy emission layer having a stripe shape and surrounding the first dummy emission layer.

13. The electroluminescent display device according to claim 12, wherein one of the plurality of dummy emission layers with a portion of the dummy bank adjacent to the one of the plurality dummy emission layers forms a unit dummy pattern.

14. The electroluminescent display device according to claim 12, wherein the plurality dummy emission layers include a first dummy emission layer and a second dummy emission layer, and
   wherein the first dummy emission layer has a bent shape surrounding a corner edge area in the active area of the substrate and the second dummy emission layer has the same shape as the second dummy emission layer and arranged at the non-active area.

15. The electroluminescent display device according to claim 14, wherein adjacent two of the second dummy emission layers face each other and are arranged to form a rectangular shape.

16. The electroluminescent display device according to claim 15, wherein the dummy bank has a bent shape surrounding the first dummy emission layer and the second dummy emission layer.

17. The electroluminescent display device according to claim 12, wherein the dummy emission layer has a stripe shape.

18. The electroluminescent display device according to claim 17, wherein the dummy bank has the stripe shape and surrounds the dummy emission layer.

19. The electroluminescent display device according to claim 12, wherein the dummy bank surrounds the first, second and third dummy emission layers.

\* \* \* \* \*